(12) United States Patent
Schmidt et al.

(10) Patent No.: US 10,062,673 B2
(45) Date of Patent: Aug. 28, 2018

(54) PC-LED MODULE WITH ENHANCED WHITE RENDERING AND CONVERSION EFFICIENCY

(71) Applicant: PHILIPS LIGHTING HOLDING B.V., Eindhoven (NL)

(72) Inventors: Peter Josef Schmidt, Eindhoven (NL); Hans-Helmut Bechtel, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 15/508,372

(22) PCT Filed: Aug. 5, 2015

(86) PCT No.: PCT/EP2015/068077
§ 371 (c)(1),
(2) Date: Mar. 2, 2017

(87) PCT Pub. No.: WO2016/037773
PCT Pub. Date: Mar. 17, 2016

(65) Prior Publication Data
US 2017/0263592 A1    Sep. 14, 2017

(30) Foreign Application Priority Data

Sep. 11, 2014 (EP) ..................... 14184423

(51) Int. Cl.
*F21V 9/16* (2006.01)
*H01L 25/075* (2006.01)
(Continued)

(52) U.S. Cl.
CPC .......... *H01L 25/0753* (2013.01); *C09K 11/02* (2013.01); *C09K 11/025* (2013.01);
(Continued)

(58) Field of Classification Search
CPC .............. F21Y 2115/10; F21Y 2105/10; F21Y 2113/13; F21Y 2113/10; F21V 9/16; F21V 7/22; F21V 9/06; F21V 9/08; F21K 9/64
(Continued)

(56) References Cited

U.S. PATENT DOCUMENTS

| 2004/0051111 A1 | 3/2004 | Gundula et al. |
| 2004/0217364 A1 | 11/2004 | Tarsa et al. |

(Continued)

FOREIGN PATENT DOCUMENTS

| CN | 101137738 A | 3/2008 |
| CN | 101184823 A | 5/2008 |

(Continued)

*Primary Examiner* — William Carter
(74) *Attorney, Agent, or Firm* — Akarsh P. Belagodu

(57) ABSTRACT

The invention provides a lighting device (100) comprising: —a first solid state light source (10), configured to provide UV radiation (11) having a wavelength selected from the range of 380-420 nm; —a second solid state light source (20), configured to provide blue light (21) having a wavelength selected from the range of 440-470 nm; —a wavelength converter element (200), wherein the wavelength converter element (200) comprises: —a first luminescent material (210), configured to provide upon excitation with the blue light (21) of the second solid state light source (20) first luminescent material light (211) having a wavelength selected from the green and yellow wavelength range, and wherein the first luminescent material excitability for UV radiation (11) is lower than for blue light (21); and —a second luminescent material (220), configured to provide upon excitation with the blue light (21) of the second solid state light source (20) second luminescent material light (221) having a wavelength selected from the orange and red wavelength range, and wherein the second luminescent (Continued)

material excitability for UV radiation (11) is lower than for blue light (21).

13 Claims, 3 Drawing Sheets

(51) Int. Cl.
    *F21V 9/30*           (2018.01)
    *C09K 11/02*         (2006.01)
    *C09K 11/08*         (2006.01)
    *F21K 9/64*           (2016.01)
    *C09K 11/61*         (2006.01)
    *C09K 11/77*         (2006.01)
    *C09K 11/88*         (2006.01)
    *H01L 33/50*         (2010.01)
    *F21Y 115/10*        (2016.01)
    *F21Y 113/13*        (2016.01)
    *F21Y 113/17*        (2016.01)

(52) U.S. Cl.
    CPC .......... *C09K 11/08* (2013.01); *C09K 11/0883* (2013.01); *C09K 11/617* (2013.01); *C09K 11/7718* (2013.01); *C09K 11/7731* (2013.01); *C09K 11/7734* (2013.01); *C09K 11/7774* (2013.01); *C09K 11/886* (2013.01); *F21K 9/64* (2016.08); *F21V 9/16* (2013.01); *F21V 9/30* (2018.02); *F21Y 2113/13* (2016.08); *F21Y 2113/17* (2016.08); *F21Y 2115/10* (2016.08); *H01L 33/504* (2013.01); *H01L 2924/0002* (2013.01)

(58) Field of Classification Search
    USPC .......................................................... 362/84
    See application file for complete search history.

(56) References Cited

U.S. PATENT DOCUMENTS

| | | |
|---|---|---|
| 2005/0274930 A1 | 12/2005 | Gundula et al. |
| 2008/0198573 A1 | 8/2008 | Juestel et al. |
| 2008/0203892 A1 | 8/2008 | Meyer et al. |
| 2009/0020775 A1 | 1/2009 | Radkov et al. |
| 2009/0167149 A1 | 7/2009 | Ito |
| 2009/0224652 A1* | 9/2009 | Li ..................... C09K 11/0883 313/498 |
| 2011/0102706 A1 | 2/2011 | Shozo |
| 2012/0043552 A1 | 2/2012 | David et al. |
| 2014/0055982 A1* | 2/2014 | Tao ........................... F21V 9/16 362/84 |
| 2014/0160728 A1* | 6/2014 | Kim ..................... H01L 25/0753 362/84 |
| 2011/5029514 | 10/2015 | Bechtel et al. |

FOREIGN PATENT DOCUMENTS

| | | |
|---|---|---|
| CN | 104781942 A | 7/2015 |
| JP | 2012009684 A | 1/2012 |
| JP | 2013079311 A | 5/2013 |
| RU | 2003123094 A | 2/2005 |
| RU | 86795 U1 | 9/2009 |
| RU | 2010107024 A | 8/2011 |
| RU | 2010121214 A | 12/2011 |
| WO | WO2013150470 A1 | 10/2013 |
| WO | WO2014030148 A2 | 2/2014 |
| WO | WO2014068440 A1 | 5/2014 |

* cited by examiner

PC-LED MODULE WITH ENHANCED WHITE RENDERING AND CONVERSION EFFICIENCY

CROSS-REFERENCE TO PRIOR APPLICATIONS

This application is the U.S. National Phase application under 35 U.S.C. § 371 of International Application No. PCT/EP2015/068077, filed on Aug. 5, 2015, which claims the benefit of European Patent Application No. 14184423.3, filed on Sep. 11, 2014. These applications are hereby incorporated by reference herein.

FIELD OF THE INVENTION

The invention relates to a lighting device and to a wavelength converter element for use in such lighting device.

BACKGROUND OF THE INVENTION

Lighting systems with multiple phosphors are known in the art. US2012043552, for instance, describes a pump LED (light emitting diode) light of selected wavelengths with multiple phosphors. In various embodiments of this prior art, LEDs emitting radiation at violet and/or ultraviolet wavelengths are used to pump phosphor materials that emit light of a different frequency. The pump LEDs are characterized by having a peak emission wavelength of about 405 to 430 nm under normal operation. They are employed in conjunction with at least a blue phosphor with strong absorption at wavelengths beyond about 405 nm. In certain embodiments, LEDs operating in different wavelength ranges are arranged in a combination to reduce radiation re-absorption and improve light-output efficiency. US2012043552 proposes an optical device which includes a mounting member and at least one light emitting diode overlying a portion of the mounting member. The LED includes a gallium and nitrogen containing substrate having a surface region and a gallium and nitrogen containing buffer layer overlying the surface region. An active region emits electromagnetic radiation with peak wavelengths in a range from about 405 nm to about 430 nm. The LED includes electrical contacts to supply the junction region electrical current. The device additionally includes a mixture of three phosphor materials within a binder material. The mixture of phosphor materials is disposed within a vicinity of the LED interacts with the electromagnetic radiation from the LED to convert the electromagnetic radiation to a wavelength range between about 440 to 650 nanometers. In another embodiment the device includes blue phosphor material within a vicinity of the LED device with strong absorption at wavelengths longer than about 405 nm.

WO2014/068440 describes a lighting unit comprising a source of blue light, a source of green light, a first source of red light comprising a first red luminescent material, configured to provide red light with a broad band spectral light distribution, and a second source of red light comprising a second red luminescent material, configured to provide red light with a spectral light distribution comprising one or more red emission lines. Especially, the first red luminescent material comprises $(Mg,Ca,Sr)AlSiN_3$:Eu and/or $(Ba,Sr,Ca)_2Si_{5-x}Al_xO_xN_{8-x}$:Eu, and the second red luminescent material comprises $K_2SiF_6$:Mn.

US2004217364 describes a white light emitting lamp is disclosed comprising a solid state ultra violet (UV) emitter that emits light in the UV wavelength spectrum. A conversion material is arranged to absorb at least some of the light emitting from the UV emitter and re-emit light at one or more different wavelengths of light. One or more complimentary solid state emitters are included that emit at different wavelengths of light than the UV emitter and the conversion material. The lamp emits a white light combination of light emitted from the complimentary emitters and from the conversion material, with the white light having high efficacy and good color rendering. Other embodiments of white light emitting lamp according to the present invention comprises a solid state laser instead of a UV emitter.

SUMMARY OF THE INVENTION

LED lamps containing chip on board (CoB) type LED modules showing enhanced whiteness rendering due to emission in the violet spectral range are commercially available. These LED modules are e.g. based on violet light emitting LEDs and mixtures of blue, green and red phosphors to generate high CRI (color rendering index) white spectra with additional emission in the violet spectral range due to LED pump light leaking through the phosphor layer.

Even though these violet pumped LED lamps show excellent color rendition and enhanced white rendering due to emission peak at around 410 nm, the conversion of high energy violet photons into visible photons with the RGB phosphor mix leads to a rather low energy efficiency due to the large Stokes loss. In addition, the fraction of non-converted violet light needs to be rather high since an increased optical thickness of the phosphor layer leading to stronger luminescence down-conversion would drastically decrease conversion efficiency due to scattering losses. Scattering losses within the phosphor layer of the violet pump+RGB phosphor concept are high because a large fraction of the blue light emitted by the blue Eu(II) phosphor $(M_3MgSi_2O_8$:Eu or $M_5(PO_4)_3Cl$:Eu with M=Ca, Sr, Ba are typically being used) is absorbed by the green-yellow and red emitting phosphors applied.

High violet emission contents in the white spectrum however are considered as being harmful due to the enhanced photoreactivity of violet light compared to blue light. An improved concept with respect to reduced violet light content in the spectrum and luminous efficiency may be a LED module that combines violet LEDs with blue LEDs and a phosphor mix showing conversion into green to red light to provide a system that combines high color rendition with enhanced white rendering. Because violet LEDs are mixed with blue LEDs the Stokes loss becomes smaller and the LED modules thus more energy efficient. The spectral content of the photoactive violet light can be more easily tuned with this concept without a phosphor down-conversion efficiency penalty than with the violet LED+RGB phosphor mix approach. A remaining drawback of this concept however is, that the described red emitting phosphors such as $(Ca,Sr)SiAlN_3$:Eu or $(Ba,Sr,Ca)_2Si_{5-x}Al_x N_{8-x}O_x$:Eu show stronger absorption in the violet than in the blue spectral range, thus a significant amount of violet photons are converted into red photons.

Hence, it is an aspect of the invention to provide an alternative device with an enhanced white rendering and enhanced conversion efficiency, which (thus) preferably further at least partly obviate one or more of above-described drawbacks.

Hence, in a first aspect the invention provides a lighting device ("PC-LED module (phosphor converter LED module)") comprising:

a first solid state light source (herein also indicated as "first light source"), configured to provide UV radiation ("first light source radiation" or "UV light") having a wavelength selected from the range of 380-420 nm;

a second solid state light source (herein also indicated as "second light source"), configured to provide blue light (herein also indicated as "second light source light") having a wavelength selected from the range of 440-470 nm;

a wavelength converter element, wherein the wavelength converter element comprises:

a first luminescent material, configured to provide upon excitation with the blue light of the second solid state light source first luminescent material light having a wavelength selected from the green and yellow wavelength range, and wherein the first luminescent material excitability for UV radiation is lower than for blue light; and a second luminescent material, configured to provide upon excitation with the blue light of the second solid state light source second luminescent material light having a wavelength selected from the orange and red wavelength range, and wherein the second luminescent material excitability for UV radiation is (also) lower than for blue light, as further defined in the accompanying claims.

Such device may surprisingly provide white light with a high efficiency, high color rendering and high white rendering, unlike state of the art devices wherein e.g. large Stokes shift leads to high losses. With the present invention, the two luminescent materials may provide, together with the blue light of the second solid state light source, white light. The UV radiation further increases the white rendering of the lighting device light, which comprises in a specific embodiment (at least temporarily) first light source radiation (i.e. the UV light of the first light source), second light source light or blue light, and luminescent material light of the two luminescent materials. Hence, the light sources and luminescent materials are configured to wavelength convert no or only a part of the UV radiation of the first light source and are configured to convert part of the blue light of the second light source into visible radiation emitting at least in one or more of the green, yellow, orange and red part of the spectrum. Hence, the present invention is especially based on the principle of UVRYB (UV, red, yellow and blue) or UVRGB (UV, red, green, and blue) principle, though combinations may also be possible (i.e. UVRYGB). For instance, some cerium doped garnet luminescent materials luminesce both in the green and yellow. The phrase "having a wavelength selected from the range of 380-420 nm" and similar phrases, may especially indicate that the dominant wavelength is found within this wavelength range. Hence, especially the dominant wavelength of the first light source and of the second light source are (of course) unequal. Likewise, the dominant wavelengths of the first luminescent material and second luminescent material are especially (of course) unequal (and both are independently unequal with the respective dominant wavelengths of the first light source and of the second light source). Hence, the optical spectrum of the lighting device light from UV to red may especially include at least four maxima.

The term "luminescent material" may also relate to a plurality of different luminescent materials. Hence, the lighting device may comprise more than two different luminescent materials, but at least one that qualifies as first luminescent material and at least one that qualifies as second luminescent material. The first and the second luminescent materials are (thus) different luminescent materials.

The term "light source" may also relate to a plurality of light sources, such as 2-20 (solid state) LED light sources. Hence, the term LED may also refer to a plurality of LEDs. The lighting device may thus comprise more than two different light sources, but at least one that qualifies as first light source and at least one that qualifies as second light source. The first and the second light sources are (thus) different light sources. Especially, the light sources comprise solid state LED light sources (such as a LED or laser diode).

A specific feature of the luminescent material is that the first luminescent material excitability for UV radiation is lower than for blue light and that the second luminescent material excitability for UV radiation is lower than for blue light. In other words, when recording an excitation spectrum of the luminescent materials, there will be a higher excitation maximum in the blue wavelength range than in the UV wavelength range. This can also be redefined in terms of absorption spectrum or reflection spectrum: the absorption maximum is higher and the reflection minimum is lower in the blue wavelength range than the absorption maximum and reflection minimum in the UV wavelength range, respectively. In this way, the UV absorption may be relatively low, leading to a higher efficiency and a higher color rendering, whereas the blue absorption may be relatively high, which thus also leads to a higher efficiency (less Stokes losses).

A number of luminescent materials may qualify for the present application. Here below, first some luminescent material classes are discussed in general and thereafter some specific classes are discussed in more detail.

General Discussion on Suitable Luminescent Materials

In the general discussion, the indications of the specific elements has substantially been unified.

In a specific embodiment, the first luminescent material is selected from the group consisting of the $A_3B_5O_{12}:Ce^{3+}$ class, the $MA_2O_4:Ce^{3+}$ class, the $MS:Ce^{3+}$ class and the $A_3Z_6N_{11}:Ce^{3+}$ class, wherein A is selected from the group of lanthanides (such as Gd, Tb, Lu), scandium, yttrium and lanthanum, wherein B is selected from the group of aluminum and gallium, wherein M is selected from the group of earth alkaline elements (such as Mg, Ca, Sr, Ba), and wherein Z is selected from the group of silicon and germanium.

The first class ($A_3B_5O_{12}:Ce^{3+}$ class; herein also indicated as $Y,Gd,Lu)_3(Al,Ga)_5O_{12}:Ce^{3+}$ class) is the class of the garnet systems (which is further described below in the more detailed discussion on suitable luminescent materials). The materials within this class have a cubic, Ia-3d, crystal structure. Examples of members within this class are $Y_3Al_5O_{12}:Ce^{3+}$ and $Lu_3Al_5O_{12}:Ce^{3+}$, etc.

The second class ($MA_2O_4:Ce^{3+}$ class; herein also indicated as $CaSc_2O_4:Ce^{3+}$ class) is the class of alkaline earth scandate systems. The materials within this class have an orthorhombic $CaFe_2O_4$ type crystal structure. An example of a member within this class is $CaSc_2O_4:Ce^{3+}$.

The third class ($MS:Ce^{3+}$ class; herein also indicated as the $(Sr,Ba,Ca)(Se,S):Ce^{3+}$ class) is the class of alkaline earth sulphide systems crystallizing in the cubic rock salt structure type. An example of a member within this class is $CaS:Ce^{3+}$.

The fourth class ($A_3Z_6N_{11}:Ce^{3+}$ class; herein also indicated as the $La_3Si_6N_{11}:Ce^{3+}$ class) is the class of rare earth nitridosilicate systems. The materials within this class have a tetragonal $Sm_3Si_6N_{11}$ type crystal structure. An example of a member within this class is $La_3Si_6N_{11}:Ce^{3+}$.

Note that each of these systems have cerium as dopant, though co-dopants (such as praseodymium) are not excluded.

Further members of the above classes may provide green and/or yellow light upon excitation by blue light and may be better excitable in the blue than in the UV.

In a further specific embodiment, the second luminescent material is selected from the group of the MD:Eu class, the $MGB_3N_4$:Eu class and/or the $MM''_3ZN_4$:Eu class and/or the $M'B_2M''_2N_4$:Eu class (optionally these may be considered to belong to a single class (see also below)), and the $G_2ZF_6$:Mn class, wherein M is selected from the group of earth alkaline elements, wherein M' is selected from the group of Sr, Ba and Ca, wherein M" is selected from the group of Mg, Mn, Zn and Cd, wherein D is selected from the group of S and Se, wherein Z is selected from the group of Si, Ge, Ti, Hf, Zr, Sn, B is selected from the group of B, Al, Ga, Sc and wherein G is selected from the group of alkaline elements (such as Li, Na, K, etc.).

The first class (MD:Eu class; herein also indicated as the (Sr,Ba,Ca)(Se,S):Eu class) is the class of alkaline earth chalcogenide systems. The materials within this class have a cubic rock salt crystal structure. Examples of members within this class are SrS:Eu, CaS:Eu, CaSe:Eu, etc.

The second class (MGB3N4:Eu class; herein also indicated as the SrLiAl3N4:Eu class) is the class of nitridoaluminate systems. The materials within this class have a tetragonal potassium lithium plumbate type crystal structure. An example of a member within this class is SrLiAl3N4:Eu.

The third class (MM"3ZN4:Eu class; herein also indicated as the CaBe3SiN4:Eu class) is the class of ortho nitridosilicate systems. The materials within this class have a tetragonal sodium lithium silicate type crystal structure. An example of a member within this class is CaBe3SiN4:Eu.

The fourth class (M'B2M"2N4:Eu class; herein also indicated as the SrAl2Mg2N4:Eu class) is the class of magneso nitridoaluminate systems. The materials within this class have a tetragonal uranium chromium carbide type crystal structure. An example of a member within this class is SrAl2Mg2N4:Eu.

The fifth class (G2ZF6:Mn class; herein also indicated as the K2SiF6:Mn class) is the class of complex fluoride systems. The materials within this class have a cubic Hieratite or hexagonal Demartinite type crystal structure. An example of a member within this class is K2SiF6:Mn. (IV; i.e. tetravalent manganese).

Further, examples of members of this class are given below. Note that most of these systems have divalent europium as dopant, though co-dopants (such as cerium and/or divalent manganese) are not excluded. The last class in the group comprises tetravalent manganese.

Hence, in a specific embodiment the first luminescent material is selected from the group consisting of the (Y,Gd,Lu)3(Al,Ga)5O12:Ce3+, CaSc2O4:Ce3+, CaS:Ce3+ and La3Si6N11:Ce3+, and the second luminescent material is selected from the group of (Sr,Ba,Ca)(Se,S):Eu, SrLiAl3N4:Eu, CaBe3SiN4:Eu, SrAl2Mg2N4:Eu, and K2SiF6:Mn.

Therefore, in a further aspect the invention also provides a light converter per se, i.e. a light converter comprising a first luminescent material selected from the group consisting of the (Y,Gd,Lu)3(Al,Ga)5O12:Ce3+ class, the CaSc2O4:Ce3+ class, the (Sr,Ba,Ca)(Se,S):Ce class, and the La3Si6N11:Ce3+ class, and a second luminescent material selected from the group of the (Sr,Ba,Ca)(Se,S):Eu class, the SrLiAl3N4:Eu class, the CaBe3SiN4:Eu class, the SrAl2Mg2N4:Eu class, and the K2SiF6:Mn class, even more especially a light converter comprising a first luminescent material selected from the group consisting of (Y,Gd,Lu)3(Al,Ga)5O12:Ce3+, CaSc2O4:Ce3+ and La3Si6N11Ce3+, and a second luminescent material selected from the group of (Sr,Ba,Ca)(Se,S):Eu, SrLiAl3N4:Eu, CaBe3SiN4:Eu, SrAl2Mg2N4:Eu, and K2SiF6:Mn.

The term "class" herein especially refers to a group of materials that have the same crystallographic structure. Further, the term "class" may also include partial substitutions of cations and/or anions. For instance, in some of the above-mentioned classes Al—O may partially be replaced by Si—N (or the other way around).

Further, the fact that the above indicated luminescent materials are indicated to be doped with europium (Eu), or cerium (Ce), or manganese (Mn) does not exclude the presence of co-dopants, such the Eu,Ce, wherein europium is co-doped with cerium, Ce,Pr, wherein cerium is codoped with praseodymium, Ce,Na, wherein cerium is codoped with sodium, Ce,Mg, wherein cerium is codoped with magnesium, Ce,Ca, wherein cerium is codoped with calcium, etc., etc. Codoping is known in the art and is known to sometimes enhance the quantum efficiency and/or to tune the emission spectrum.

In an embodiment, the absorption ratio (or excitation ratio) for the blue maximum relative to the UV maximum is at least 1.5, such as at least 1.6, for green to yellow emitting first luminescent materials, the absorption ratio (or excitation ratio) for the blue maximum relative to the UV maximum is at least 1.1, such as at least 1.15 for the red emitting second luminescent material. In a more specific embodiment the absorption ratio (or excitation ratio) $ABS_{460}/ABS_{410}$ is at least 1.5 for green to yellow emitting first luminescent material and wherein the absorption ratio (or excitation ratio) and $ABS_{460}/ABS_{410}$ is at least 1.1 for the red emitting second luminescent material. The above indicated excitation ratios refer to the excitation ratios when monitoring the emission at the indicated emissions (i.e. e.g. green or yellow, and red, respectively). When measuring an excitation spectrum, in general the emission is measured at maximum emission intensity.

Especially, the light sources are configured to provide less than 10%, especially less than 5%, of their total optical power in the wavelength range of 380-430 nm, even more especially in the wavelength range of 400-430 nm.

Detailed Discussion on Specific Luminescent Materials

In the more detailed description of specific luminescent materials, the formulation of the chemical formulas may differ from the above formulations. This has been done to define these specific luminescent materials in more detail.

In a specific embodiment, the first luminescent material comprises $A_3B_5O_{12}$:$Ce^{3+}$ wherein A is selected from the group consisting of Sc, Y, Tb, Gd, and Lu, wherein B is selected from the group consisting of Al and Ga. Preferably, M at least comprises one or more of Y and Lu, and wherein B at least comprises Al. These types of materials may give highest efficiencies. In a specific embodiment, the second luminescent material comprises at least two luminescent materials of the type of $A_3B_5O_{12}$:$Ce^{3+}$, wherein A is selected from the group consisting of Y and Lu, wherein B is selected from the group consisting of Al, and wherein the ratio Y:Lu differ for the at least two luminescent materials. For instance, one of them may be purely based on Y, such as $Y_3Al_5O_{12}$:$Ce^{3+}$ and one of them may be a Y,Lu based system, such as $(Y_{0.5}Lu_{0.5})_3Al_5O_{12}$:$Ce^{3+}$. Embodiments of garnets especially include $A_3B_5O_{12}$ garnets, wherein A comprises at least yttrium or lutetium and wherein B comprises at least aluminum. Such garnet may be doped with cerium (Ce), with praseodymium (Pr) or a combination of cerium and praseodymium; especially however with Ce. Especially, B comprises aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3Al_5O_{12}$:Ce, wherein x is equal to or larger than 0 and equal to or smaller than 1. The terms ":Ce" or ":$Ce^{3+}$" (or similar terms), indicate that part of the metal ions (i.e. in the garnets: part of the "M" ions) in the luminescent material is replaced by Ce (or another luminescent species when the term(s) would indicate that, like ":Yb"). For instance, assuming $(Y_{1-x}Lu_x)_3Al_5O_{12}$:Ce, part of Y and/or Lu is replaced by Ce. This notation is known to the person skilled in the art. Ce will replace M in general for not more than 10%; in general, the Ce concentration will be in the range of 0.1-4%, especially 0.1-2% (relative to M). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art.

In yet a further embodiment, which may especially be combined with the former embodiment, the second luminescent material comprises $M_{1-x-y-z}Z_zA_aB_bC_cD_dE_eN_{4-n}O_n$: $ES_x,RE_y$, with M=selected from the group consisting of Ca (calcium), Sr (strontium), and Ba (barium); Z selected from the group consisting of monovalent Na (sodium), K (potassium), and Rb (rubidium); A=selected from the group consisting of divalent Mg (magnesium), Mn (manganese), Zn (zinc), and Cd (cadmium) (especially, A=selected from the group consisting of divalent Mg (magnesium), Mn (manganese), and Zn (zinc), even more especially selected from the group consisting of divalent Mg (magnesium), Mn (manganese); B=selected from the group consisting of trivalent B (boron), Al (aluminum) and Ga (gallium); C=selected from the group consisting of tetravalent Si (silicon), Ge (germanium), Ti (titanium) and Hf (hafnium); D selected from the group consisting of monovalent Li (lithium), and Cu (copper); E selected for the group consisting of P (the element phosphor), V (vanadium), Nb (niobium), and Ta (tantalum); ES=selected from the group consisting of divalent Eu (europium), Sm (samarium) and ytterbium, especially selected from the group consisting of divalent Eu and Sm; RE=selected from the group consisting of trivalent Ce (cerium), Pr (praseodymium), Nd (neodymium), Sm (samarium), Eu (europium), Gd (gadolinium), Tb (terbium), Dy (dysprosium), Ho (holmium), Er (erbium), and Tm (thulium); with $0 \le x \le 0.2$; $0 \le y \le 0.2$; $0 < x+y \le 0.4$; $0 \le z < 1$; $0 \le n \le 0.5$; $0 \le a \le 4$ (such as $2 \le a \le 3$); $0 \le b \le 4$; $0 \le c \le 4$; $0 \le d \le 4$; $0 \le e \le 4$; $a+b+c+d+e=4$; and $2a+3b+4c+d+5e=10-y-n+z$. Especially, $z \le 0.9$, such as $z \le 0.5$. Further, especially $x+y+z \le 0.2$.

The equations $a+b+c+d+e=4$; and $2a+3b+4c+d+5e=10-y-n+z$, respectively, especially determine the Z, A, B, C, D and E cations and O and N anions in the lattice and thereby define (also) the charge neutrality of the system. For instance, the charge compensation is covered by the formula $2a+3b+4c+d+5e=10-y-n+z$. It covers e.g. charge compensation by decreasing O content or charge compensation by substituting a C cation by a B cation or a B cation by an A cation, etc. For example: x=0.01, y=0.02, n=0, a=3; then 6+3b+4c=10-0.02; with a+b+c=4:b=0.02, c=0.98.

As will be clear to a person skilled in the art, a, b, c, d, e, n, x, y, z are always equal to or larger than zero. When a is defined in combination with the equations $a+b+c+d+e=4$; and $2a+3b+4c+d+5e=10-y-n+z$, then in principle, b, c, d, and e do not need to be defined anymore. However, for the sake of completeness, herein also $0 \le b \le 4$; $0 \le c \le 4$; $0 \le d \le 4$; $0 \le c \le 4$ are defined.

Assume a system like $SrMg_2Ga_2N_4$:Eu. Here, a=2, b=2, c=d=e=y=z=n=0. In such system, 2+2+0+0+0=4 and 2*2+ 3*2+0+0+0=10-0-0+0=10. Hence, both equations are complied with. Assume that 0.5 O is introduced. A system with 0.5 O can e.g. be obtained when 0.5 Ga—N is replaced by 0.5 Mg—O(which is a charge neutral replacement). This would result in $SrMg_{2.5}Ga_{1.5}N_{3.5}O_{0.5}$:Eu. Here, in such system 2.5+1.5+0+0+0=4 and 2*2.5+3*1.5+0+0+0=10-0-0.5++0=9.5. Hence, also here both equations are complied with.

As indicated above, in an advantageous embodiment d>0 and/or z>0, especially at least d>0. Especially, the phosphor comprises at least lithium.

In yet another embodiment, $2 \le a \le 3$, and especially also d=0, e=0 and z=0. In such instances, the phosphor is amongst others characterized by a+b+c=4; and 2a+3b+4c=10-y-n.

In a further specific embodiment, which may be combined with the former embodiments e=0. In yet a further specific embodiment, which may be combined with the former embodiments, M is Ca and/or Sr.

Hence, in a specific embodiment, the phosphor has the formula $M(Ca$ and/or $Sr)_{1-x-y}Mg_aAl_bSi_cN_{4-n}O_n$:$ES_x,RE_y$ (I), with ES=selected from the group consisting of divalent Eu (europium) or Sm (samarium) or Yb (ytterbium); RE=selected from the group consisting of trivalent Ce (cerium), Pr (praseodymium), Nd (neodymium), Sm (samarium), Eu (europium), Gd (gadolinium), Tb (terbium), Dy (dysprosium), Ho (holmium), Er (erbium), and Tm (thulium), wherein y/x<0.1, especially <0.01, and $n \le 0.1$, especially <0.01, even more especially <0.001, yet even more especially <0.0001. Hence, in this embodiment, substantially samarium and or europium containing phosphors are described. For instance, when divalent Eu is present, with x=0.05, and for instance y1 for Pr may be 0.001, and y2 for Tb may be 0.001, leading to an y=y1+y2=0.002. In such instance, y/x=0.04. Even more especially, y=0. However, as indicated elsewhere when Eu and Ce are applied, the ratio y/x may be larger than 0.1.

The condition $0 < x+y \le 0.4$ indicates that M may be substituted with in total up to 40% of ES and/or RE. The condition "$0 < x+y \le 0.4$" in combination with x and y being between 0 and 0.2 indicates that at least one of ES and RE are present. Not necessarily both types are present. As indicated above, both ES and RE may each individually refer to one or more subspecies, such as ES referring to one or more of Sm and Eu, and RE referring to one or more of Ce, Pr, Nd, Sm, Eu, Gd, Tb, Dy, Ho, Er, and Tm.

Especially, when europium is applied as divalent luminescent species or dopant, the molar ratio between samarium and europium (Sm/Eu) is <0.1, especially <0.01, especially <0.001.

The same applies when europium in combination with ytterbium would be applied. When europium is applied as divalent luminescent species or dopant, the molar ratio between ytterbium and europium (Yb/Eu) is <0.1, especially <0.01, especially <0.001. Would all three together be applied, then the same molar ratios might apply, i.e. ((Sm+Yb)/Eu) is <0.1, especially <0.01, especially <0.001.

Especially, x is in the range of 0.001-0.2 (i.e. $0.001 \le x \le 0.2$), like 0.002-0.2, such as 0.005-0.1, especially 0.005-0.08. Especially in the case of divalent Europium in the herein described systems, the molar percentage may be in the range of 0.1-5% ($0.001 \leq x \leq 0.05$), such as 0.2-5%, like 0.5-2%. For other luminescent ions, x may (but is not necessarily) in embodiments be equal to or larger than 1% (x equal to or larger than 0.01).

In a specific embodiment, the phosphor is selected from the group consisting of $(Sr,Ca)Mg_3SiN_4$:Eu, $(Sr,Ca)Mg_2Al_2N_4$:Eu, $(Sr,Ca)LiAl_3N_4$:Eu and $(Sr,Ca)Li_dMg_aAl_bN_4$:Eu, with a, b, d as defined above.

As also indicated herein, the notation "(Sr,Ca)", and similar notations with other elements, indicates that the M-positions are occupied with Sr and/or Ca cations (or other elements, respectively).

In a further specific embodiment the phosphor is selected from the group consisting of $Ba_{0.95}Sr_{0.05}Mg_2Ga_2N_4$:Eu, $BaMg_2Ga_2N_4$:Eu, $SrMg_3SiN_4$:Eu, $SrMg_2Al_2N_4$:Eu, $SrMg_2Ga_2N_4$:Eu, $BaMg_3SiN_4$:Eu, $CaLiAl_3N_4$:Eu, $SrLiAl_3N_4$:Eu, $CaLi_{0.5}MgAl_{2.5}N_4$:Eu, and $SrLi_{0.5}MgAl_{2.5}N_4$:Eu.

Further (non-limiting) examples for such phosphors are e.g. $(Sr_{0.8}Ca_{0.2})_{0.995}LiAl_{2.91}Mg_{0.09}N_{3.91}O_{0.09}$: $Eu_{0.005}$; $(Sr_{0.9}Ca_{0.1})_{0.905}Na_{0.09}LiAl_3N_{3.91}O_{0.09}$:$Eu_{0.005}$; $(Sr_{0.8}Ca_{0.03}Ba_{0.17})_{0.989}LiAl_{2.99}Mg_{0.01}N_4$:$Ce_{0.01}$, $Eu_{0.001}$; $Ca_{0.995}LiAl_{2.995}Mg_{0.005}N_{3.995}O_{0.005}$:$Yb_{0.005}$((YB(II)); $Na_{0.995}MgAl_3N_4$:$Eu_{0.005}$; $Na_{0.895}Ca_{0.1}Mg_{0.9}Li_{0.1}Al_3N_4$: $Eu_{0.005}$; $Sr_{0.99}LiMgAlSiN_4$:$Eu_{0.01}$; $Ca_{0.995}LiAl_{2.955}Mg_{0.045}N_{3.96}O_{0.04}$:$Ce_{0.005}$; $(Sr_{0.9}Ca_{0.1})_{0.998}Al_{1.99}Mg_{2.01}N_{3.99}O_{0.01}$:$Eu_{0.002}$; $(Sr_{0.9}Ba_{0.1})_{0.998}Al_{1.99}Mg_{2.01}N_{3.99}O_{0.01}$:$Eu_{0.002}$.

In a further specific embodiment, the phosphor is selected from the group consisting of $(Sr,Ca)Mg_3SiN_4$:Eu and $(Sr,Ca)Mg_2Al_2N_4$:Eu. In yet another specific embodiment, the phosphor is selected from the group consisting of $Ba_{0.95}Sr_{0.05}Mg_2Ga_2N_4$:Eu, $BaMg_2Ga_2N_4$:Eu, $SrMg_3SiN_4$:Eu, $SrMg_2Al_2N_4$:Eu, $SrMg_2Ga_2N_4$:Eu, and $BaMg_3SiN_4$:Eu. Especially, these phosphors, and even more especially $(Sr,Ca)Mg_3SiN_4$:Eu and $(Sr,Ca)Mg_2Al_2N_4$:Eu may be phosphors having good luminescent properties, amongst others in terms of spectral position and distribution of the luminescence.

Of especial interest are phosphors wherein the phosphor complies with $0 \leq x \leq 0.2$, $y/x<0.1$, M comprises at least Sr, $z \leq 0.1$, $a \leq 0.4$, $2.5 \leq b \leq 3.5$, B comprises at least Al, $c \leq 0.4$, $0.5 \leq d \leq 1.5$, D comprises at least Li, $e \leq 0.4$, $n \leq 0.1$, and wherein ES at least comprises Eu.

Especially, $y+z \leq 0.1$, Further, especially $x+y+z \leq 0.2$. Further, especially y is close to 0 or zero. Further, especially b is about 3. Further, especially c is close to 0 or zero. Further, especially d is about 1, Further, especially e is close to 0 or zero. Further, especially n is close to 0 or zero. Further, especially y is close to 0 or zero.

Especially good systems, in terms of quantum efficiency and hydrolysis stability are those with $z+d>0$, i.e. one or more of Na, K, Rb, Li and Cu(I) are available, especially at least Li, such as e.g. $(Sr,Ca)LiAl_3N_4$:Eu and $(Sr,Ca)Li_dMg_aAl_bN_4$:Eu, with a, b, d as defined above. In a further specific embodiment the phosphor is selected from the group consisting of $CaLiAl_3N_4$:Eu, $SrLiAl_3N_4$:Eu, $CaLi_{0.5}MgAl_{2.5}N_4$:Eu, and $SrLi_{0.5}MgAl_{2.5}N_4$:Eu.

Further phosphors of special interest are $(Sr,Ca,Ba)(Li,Cu)(Al,B,Ga)_3N_4$:Eu, which comprises as M ion at least Sr, as B ion at least Al, and as D ion at least Li.

Further Embodiments

The wavelength converter element may be a powder layer, powder dispensed in a on absorbing matrix material, a film, a polymeric plate, a ceramic plate, etc. The wavelength converter element may in an embodiment be self-supporting.

The wavelength converter element is especially at least partially transmissive for the blue light and also at least partially transmissive for the UV radiation. This implies that the material, thickness and luminescent materials content are especially chosen that part of the blue and UV radiation passes the wavelength converter element and are found downstream from the wavelength converter element. The wavelength converter element is thus especially arranged in the transmissive mode.

In an embodiment the wavelength converter element comprises a matrix wherein the first luminescent material and the second luminescent material are embedded. This matrix may be an inorganic matrix or an organic matrix or a hybrid matrix, such as a siloxane matrix. Also the term "matrix" may refer to a plurality of matrices. For instance, the first phosphor may be embedded in a first matrix and a second phosphor may be embedded in a second matrix, the two matrices forming the wavelength converter element.

Optionally, a luminescent material may be a matrix for another luminescent material.

When the luminescent materials are embedded in the matrix, the luminescent materials may especially be homogeneously distributed. This will also lead to the best light distribution of the device light.

In another embodiment, the wavelength converter element comprises a support comprising one or more coatings, wherein one or more of the coatings comprise one or more of the first luminescent material and the second luminescent material. Note that optionally a support may comprise the above-mentioned matrix.

Especially, the wavelength converter element is configured at a non-zero distance from the first solid state light source and the second solid state light source. In this way, e.g. a mixing chamber may be created. Hence, in a further embodiment the wavelength converter element is configured as window of a mixing chamber, wherein the first solid state light source and the second solid state light source are configured to provide their solid state light source light in the mixing chamber, and wherein the solid state light sources and the wavelength converter element are configured to provide lighting device light downstream from the wavelength converter element, wherein lighting device light comprises white light or wherein the lighting device is controllable to provide lighting device light being white light. When more than one first solid state light source and more than one second solid state light source are applied, especially these light sources are homogeneously distributed (e.g. in a chamber).

The phrase "wherein lighting device light comprises white light or wherein the lighting device is controllable to provide lighting device light being white light" indicates that the lighting device in an embodiment may have a substantially fixed spectral distribution of the device light. However, the lighting device may also include a controller, configured to control one or more of the solid state light sources. In this way, also the spectral distribution (and intensity) of the device light may be controlled. In the latter embodiment, the lighting device is controllable to provide lighting device light being white light.

A major advantage of the present invention is, next to the high efficiency and color rendering, that by having the two luminescent materials converting the light a substantial even distribution of the light may be created downstream from the wavelength converter element. Hence, no downstream optics are necessary, and especially no further diffuser is necessary, whereas in state of the art solutions such diffuser may be necessary. Hence, in a further embodiment the lighting device does not comprise a diffuser element arranged downstream from the wavelength converter element.

Further, it appears that with the present solution the relative UV content to the total radiation of the LED light source can be lower than in state of the art solutions. In some embodiments, the power of the second solid state light sources (blue) can be larger than 80% of the total power of the (UV and blue) solid state light sources. Hence, in an embodiment the power (in Watt) of the second solid state light source is equal to or larger than 80% of the total power (in Watt) of the first solid state light source and second solid state light source. Here, the term "power" refers to the power in Watt provided in the indicated spectral domains when the solid state light source is at maximum power.

The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream".

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting.

As indicated above, the lighting unit may be used as backlighting unit in an LCD display device. Hence, the invention provides also a LCD display device comprising the lighting unit as defined herein, configured as backlighting unit. The invention also provides in a further aspect a liquid crystal display device comprising a back lighting unit, wherein the back lighting unit comprises one or more lighting devices as defined herein.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

The terms "violet light" or "violet emission" especially relates to light having a wavelength in the range of about 380-440 nm. The terms "blue light" or "blue emission" especially relates to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 540-570 nm. The terms "orange light" or "orange emission" especially relate to light having a wavelength in the range of about 570-600. The terms "red light" or "red emission" especially relate to light having a wavelength in the range of about 600-750 nm. The term "pink light" or "pink emission" refers to light having a blue and a red component. The terms "visible", "visible light" or "visible emission" refer to light having a wavelength in the range of about 380-750 nm.

The term "substantially" herein, such as in "substantially all light" or in "substantially consists", will be understood by the person skilled in the art. The term "substantially" may also include embodiments with "entirety", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily on scale.

DETAILED DESCRIPTION OF THE EMBODIMENTS

Figure 1A:
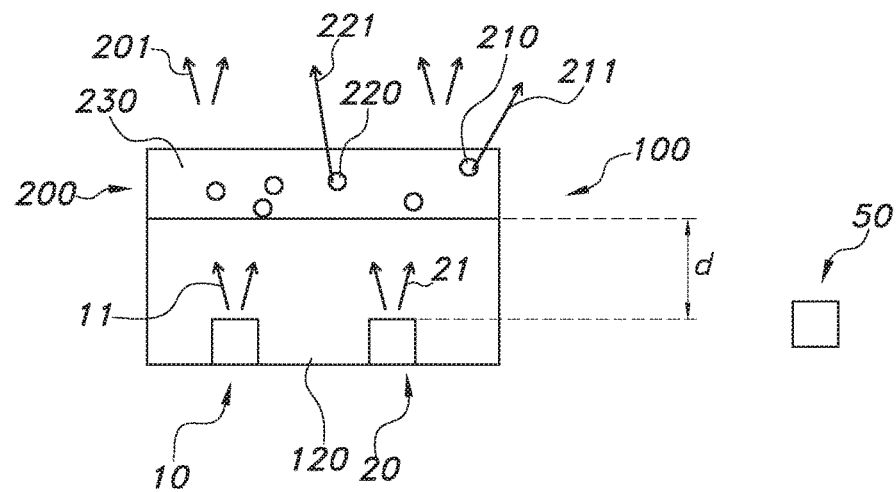
FIGS. 1a-1b schematically depict some embodiments of the lighting device as described herein.
Figure 1B:
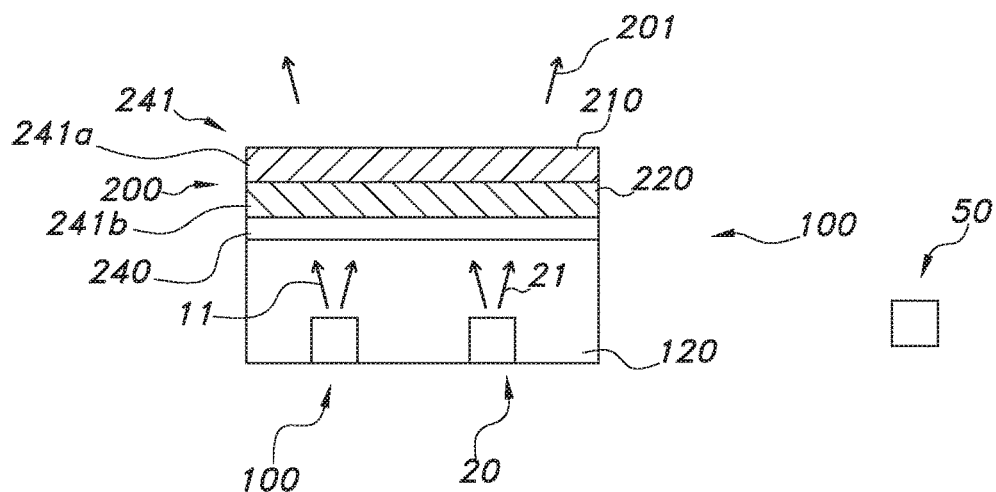

FIGS. 1a and 1b schematically depict a lighting device 100 comprising a first solid state light source 10, configured to provide UV radiation 11 having a wavelength selected from the range of 380-420 nm and a second solid state light source 20, configured to provide blue light 21 having a wavelength selected from the range of 440-470 nm. Further, the device 100 comprises a wavelength converter element 200. The wavelength converter element 200 comprises a first luminescent material 210, configured to provide upon excitation with the blue light 21 of the second solid state light source 20 first luminescent material light 211 having a wavelength selected from the green and yellow wavelength range, and a second luminescent material 220, configured to provide upon excitation with the blue light 21 of the second solid state light source 20 second luminescent material light 221 having a wavelength selected from the orange and red wavelength range.

As indicated above, the first luminescent material excitability for UV radiation 11 is lower than for blue light 21, and the second luminescent material excitability for UV radiation 11 is lower than for blue light 21 (see also examples below).

In both schematically depicted embodiments the wavelength converter element 200 is configured at a non-zero distance (d) from the first solid state light source 10 and the second solid state light source 20. Distance d may e.g. be in the range of 0.1-100 mm, such as especially 1-50 mm, like 5-50 mm.

In both embodiments, by way of example the wavelength converter element 200 is configured as window 210 of a mixing chamber 120.

In another embodiment, not depicted, the solid state light sources are fully embedded within a matrix material, which contains the wavelength converter materials. The wavelength converter materials can be homogeneously distributed within the matrix or form a homogeneous layer, as it can be generated by sedimentation of a powder in the matrix.

The lighting device provides light 201 downstream from the wavelength converter element 200. In embodiments, the lighting device light 201 is white light. Optionally a controller 50 may be configured to control the lighting device light. Hence, the lighting device 100 may be controllable to provide lighting device light 201 being white light or colored light. In this way also the color temperature may be controlled. Especially, controllability of the device light 201 may be improved by adding one or more other light sources, especially configured to emit at other wavelength ranges than the first solid state light source 210 and the second solid state light source 220. Especially, such further light source, especially further solid state light source, is configured to provide (solid state) light source light at wavelengths where at least one of the luminescent materials 210,220 does not (substantially) absorb. Hence, the dominant wavelength of the light source light of such further light source especially differs from the dominant wavelengths of the first light source and the second light source, respectively, and may even especially differ from the dominant wavelengths of the first luminescent material emission and the second luminescent material emission, respectively.

In FIG. 1a, the wavelength converter element 200 comprises a matrix 230 where in the first luminescent material 210 and the second luminescent material (220) are embedded. This may be particulate luminescent material, embedded in e.g. a polymer, such as a polymer selected from the group PE (polyethylene), PP (polypropylene), PEN (polyethylene napthalate), PC (polycarbonate), polymethylacrylate (PMA), polymethylmethacrylate (PMMA) (Plexiglas or Perspex), cellulose acetate butyrate (CAB), polyvinylchloride (PVC), polyethylene terephthalate (PET), (PETG) (glycol modified polyethylene terephthalate), PDMS (polydimethylsiloxane), and COC (cyclo olefin copolymer). However, in another embodiment matrix may comprise an inorganic material. Preferred inorganic materials are selected from the group consisting of glasses, (fused) quartz, transmissive ceramic materials, and silicones. Also hybrid materials, comprising both inorganic and organic parts may be applied. Especially preferred are PMMA, transparent PC, silicone, or glass as material for the matrix. Especially, silicone may be of interest, but also PDMS and polysilsesquioxane. In this way, the converter element may also be used as waveguide.

In FIG. 1b, the wavelength converter element 200 comprises a support 240 comprising one or more coatings 241, wherein one or more of the coatings comprise one or more of the first luminescent material 210 and the second luminescent material 220. Note that the support 240 may optionally be the matrix of the above embodiment. Here, by way of example the coatings 241 are provided at the downstream side of the support 240. However, alternatively or additionally one or more coatings may be provided at the upstream side of the support 240. Further, by way of example the first coating 241a comprises the first luminescent material 210 and a second coating 241b comprises the second luminescent material 220.

To realize the claimed LED system phosphor systems need to be selected that show strongest light absorption in the blue spectral range and only low absorption in the violet spectral range. Well-known and widely applied green to yellow emitting phosphors are Ce(III) doped garnet materials such as $Lu_3Al_5O_{12}$:Ce (LuAg) or $Y_3Al_5O_{12}$:Ce (YAG). Alternative material systems that are commercially available from Mitsubishi Chemical Company are e.g. Ce(III) doped Scandates such as $CaSc_2O_4$:Ce (green) or Ce(III) doped nitrides such as $La_3Si_6N_{11}$:Ce (yellow). For the red spectral range Eu(II) doped phosphors that combine a high symmetry dopant site (octahedral or cubic coordination) with a strong ligand field. Examples are alkaline earth sulfides such as SrS:Eu or Ca(Se,S):Eu or nitrides of composition $SrLiAl_3N_4$:Eu or $SrAl_2Mg_2N_4$:Eu. Other options for red phosphors are Mn(IV) doped fluoride materials such as $K_2SiF_6$:Mn that show narrow absorption bands in the blue spectral range due to promotion of a 3d electron of the octahedral $^4A_2$ state into the $^4T_2$ state.

Figure 2A:
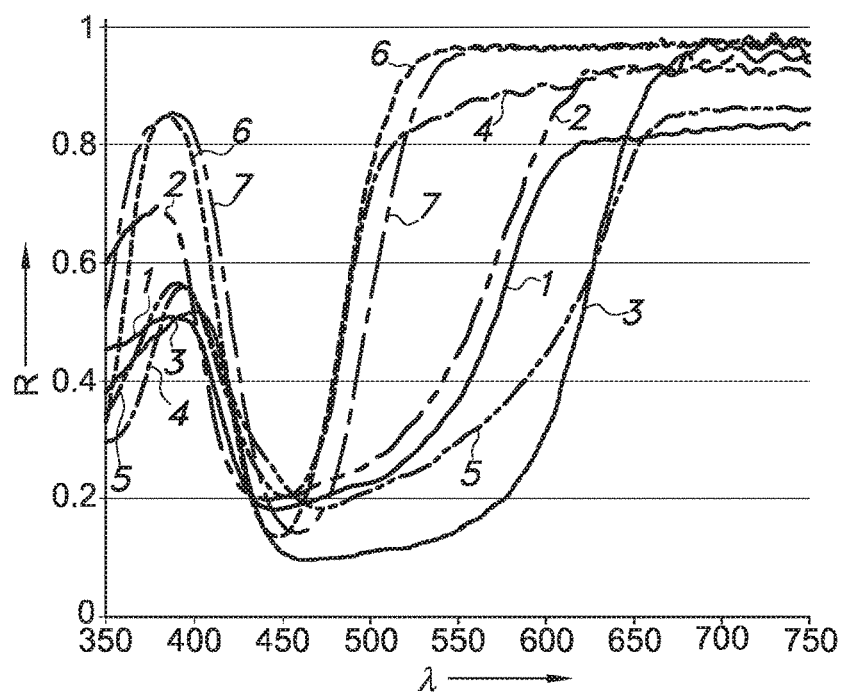
FIGS. 2a-2c show reflection and luminescence of some of the possible luminescent materials, also in relation to alternative solutions, respectively.

Especially, the LED system comprises a combination of $Lu_3Al_5O_{12}$:Ce (LuAg) or $Y_3Al_5O_{12}$:Ce (YAG) for green and yellow emitting phosphors and $SrLiAl_3N_4$:Eu as red phosphors. The combination of these phosphors is especially efficient under high operating temperatures that are typically reached in LED modules used e.g. for spot lighting due to the high flux densities required. FIG. 2a shows thick powder bed reflectance spectra of the preferred materials of the invention. The materials show significantly stronger absorption in the blue spectral range than in the violet spectral range while e.g. a red phosphor material such as CaSiAlN3:Eu shows strong absorption in the violet spectral range (not shown). In order to reach the desired conversion efficiency gains phosphor systems suitable for the current invention should absorption (ABS=1-REF) rations for 460 nm and 410 nm excitation of at least $ABS_{460}/ABS_{410}>1.6$ for green to yellow emitting phosphors and $ABS_{460}/ABS_{410}>1.17$ for red emitting phosphors for reflectance spectra of optically infinitely thick powder samples measured in air at room temperature.

Examples

FIG. 2a shows the thick powder layer reflectance spectra of Ca(0.7 Se, 0.3 S):Eu (1); (0.25 Ca, 0.75 Sr)S:Eu (2); CaS:Eu (3); K2SiF6:Mn (4); SrLiAl3N4:Eu (5); Lu3Al5O12:Ce (6); and Y3Al5O12:Ce (7) (reflection on y-axis as function of the wavelength (nm) on the x-axis).

A light source comprising 30 blue LED chips emitting at 455 nm and 6 violet LED chips emitting at 415 nm and a phosphor in silicone layer comprising LuAG (GAL515), YAG (NYAG4653) and SrLiAl3N4:Eu(0.3%) has been fabricated. The phosphor mixture of the LED module has been adjusted to maximize color rendition in the red spectral range (R9=97, CRI(8)=90) and to increase emission color separation of the yellow and red part (emission dip at ~600 nm) to improve saturated color rendition similar to similar to prior art solutions. By changing the ratio of e.g. LuAG and YAG phosphors the spectrum can be tuned to e.g. optimize for maximum luminous efficacy or overall color rendition. Table 1 summarizes the performance data of an example of the claimed lighting system. Due to the selection of phosphor that only show weak absorption in the violet spectral range the number of violet LED chips could be reduced and the luminous efficacy further enhanced compared to prior are lighting systems with enhanced whiteness rendition.

Figure 2B:
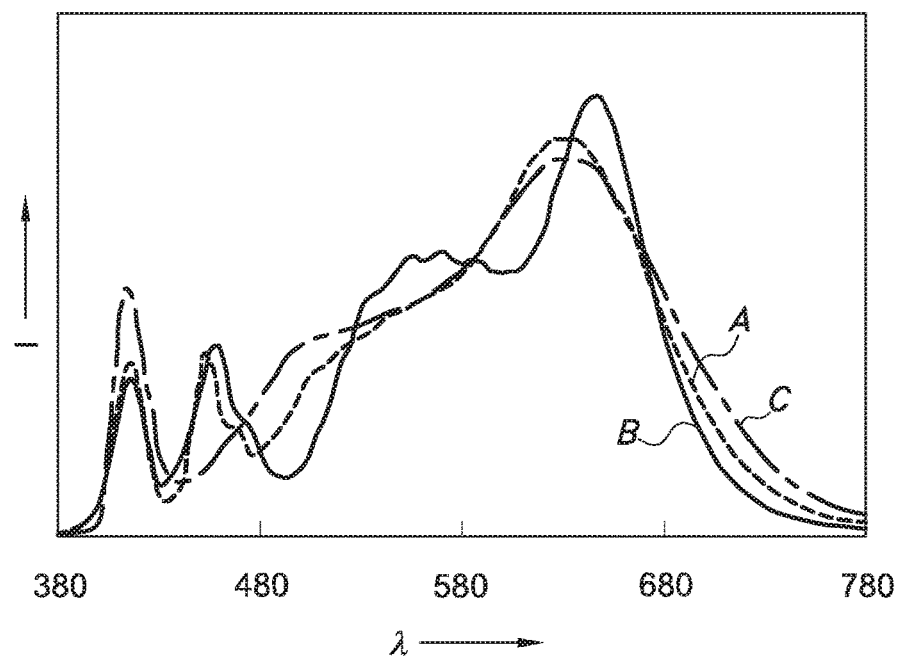

FIG. 2b: shows the emission spectra of the inventive LED system (curve B) and comparison with two alternative available solutions (A and C) (intensity on y-axis in arbitrary units as function of the wavelength (nm) on the x-axis). All correlated color temperatures 3000K. The inventive LED system shows at least four maxima.

TABLE 1 performance data of inventive LED lighting system

| LED system | Int. ratio blue/violet | $u'$ | $v'$ | LE [lm/W] | CE [lm/Wopt.] | CRI(8) | R9 |
|---|---|---|---|---|---|---|---|
| B | 85% | 0.247 | 0.516 | 272 | 184 | 90 | 97 |
| A | 60% | 0.256 | 0.518 | 262 | 169 | 97 | 90 |
| C | 0% | 0.247 | 0.518 | 251 | 156 | 97 | 97 |
| D | 88% | 0.258 | 0.525 | 316 | 210 | 93 | 86 |
| E | 79% | 0.247 | 0.519 | 315 | 208 | 94 | 56 |

Example D: CaSc2O4:Ce, YAG:Ce, K2SiF6:Mn
Example E: CaSc2O4:Ce, Ca(Se,S):Eu

As can be concluded from the table, the efficiency is very high, while also having a good color rendering index CRI and a good R9 color rendering.

Figure 2C:
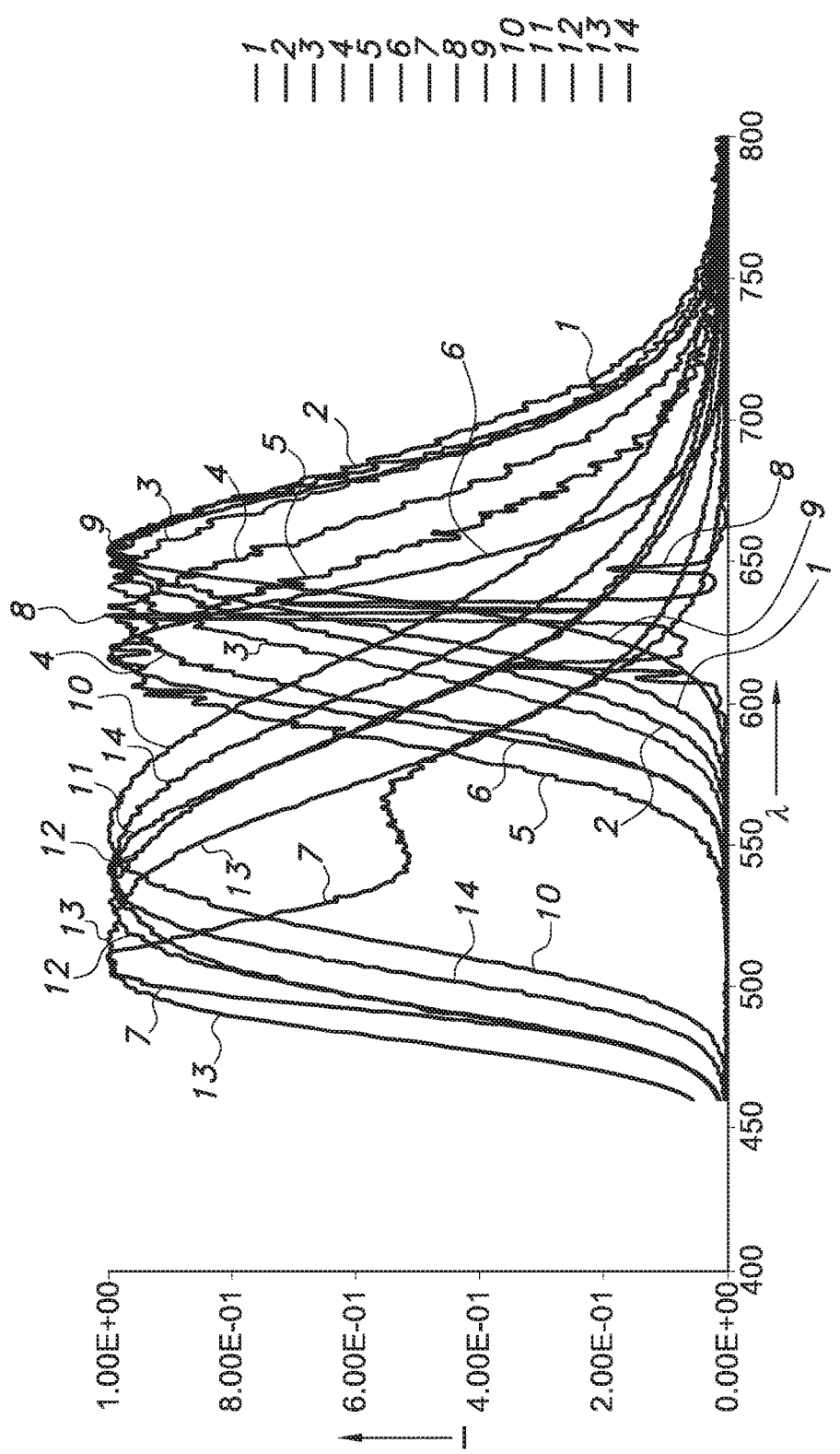

FIG. 2c shows the emission spectra (intensity on y-axis in arbitrary units as function of the wavelength (nm) on the x-axis) of examples of suitable materials: CaS:Eu (1); Ca0.75Sr0.25:Eu (2); Ca0.5Sr0.5:Eu (3); Ca0.25Sr0.75S:Eu (4); SrS:Eu (5); Ca(S,Se):Eu (6); CaS:Ce (7); K2SiF6:Mn (8); SrLiAl3N4:Eu (9); YAG:Ce (10); Lu3A5O12: Ce (LuAG) (11); Y3(Al,Ga)5O12:Ce (12); Lu3(Al,Ga)5O12:Ce (13); (Lu,Y)3Al5O12:Ce (14).

The invention claimed is:

1. A lighting device, comprising:
   a first solid state light source, configured to provide UV radiation having a wavelength selected from the range of 380-420 nm;
   a second solid state light source, configured to provide blue light having a wavelength selected from the range of 440-470 nm;
   a wavelength converter element, wherein the wavelength converter element comprises:
   a first luminescent material, configured to provide upon excitation with the blue light of the second solid state light source first luminescent material light having a wavelength selected from the green and yellow wavelength range, and wherein the first luminescent material excitability for UV radiation is lower than for blue light; and
   a second luminescent material, configured to provide upon excitation with the blue light of the second solid state light source second luminescent material light having a wavelength selected from the orange and red wavelength range, and wherein the second luminescent material excitability for UV radiation is lower than for blue light;
   wherein the lighting device is configured to provide lighting device light which comprises said UV radiation, said blue light, said first luminescent material light and said second luminescent material light;
   wherein the first and second luminescent materials, together with the blue light of the second solid state light source, are configured to provide white light; and
   wherein a first absorption ratio for a first blue maximum relative to a first UV maximum for the first luminescent material is greater than a second absorption ratio for a second blue maximum relative to a second UV maximum for the second luminescent material.

2. The lighting device according to claim 1, wherein the first luminescent material is selected from the group consisting of the A3B5O12:Ce3+ class, the MA2O4:Ce3+ class, the MS:Ce3+ class, and the A3Z6N11:Ce3+ class, wherein A is selected from the group of lanthanides, scandium, yttrium and lanthanum, wherein B is selected from the group of aluminum and gallium, wherein M is selected from the group of earth alkaline elements, and wherein Z is selected from the group of silicon and germanium.

3. The lighting device according to claim 1, wherein the second luminescent material is selected from the group of the MD:Eu class, the MGB3N4:Eu class, the M'B2M"2N4:Eu class, the MM"3ZN4:Eu class and the G2ZF6:Mn class, wherein M is selected from the group of earth alkaline elements, wherein M' is selected from the group of Sr, Ba and Ca, wherein M" is selected from the group of Be, Mg, Mn, Zn and Cd, wherein D is selected from the group of S and Se, wherein Z is selected from the group of Si, Ge, Ti, Zr, Hf, Sn and wherein G is selected from the group of alkaline elements.

4. The lighting device according to claim 1, wherein the first luminescent material comprises $A_3B_5O_{12}:Ce^{3+}$, wherein A is selected from the group consisting of Sc, Y, Tb, Gd, and Lu, and wherein B is selected from the group consisting of Al and Ga.

5. The lighting device according to claim 1, wherein the second luminescent material comprises:

$$M_{1-x-y-z}Z_zA_aB_bC_cD_dE_eN_{4-n}O_n:ES_x,RE_y \quad (I)$$

With

M=selected from the group consisting of Ca, Sr, and Ba
Z=selected from the group consisting of monovalent Na, K, and Rb
A=selected from the group consisting of divalent Mg, Mn, Zn, and Cd
B=selected from the group consisting of trivalent B, Al and Ga
C=selected from the group consisting of tetravalent Si, Ge, Ti, and Hf
D=selected from the group consisting of monovalent Li, and Cu
E=selected for the group consisting of P, V, Nb, and Ta
ES=selected from the group consisting of divalent Eu, Sm and Yb
RE=selected from the group consisting of trivalent Ce, Pr, Nd, Sm, Eu, Gd, Tb, Dy, Ho, Er, and Tm
$0 \leq x \leq 0.2$; $0 \leq y \leq 0.2$; $0 < x+y \leq 0.4$;
$0 \leq z < 1$;
$0 \leq n \leq 0.5$;
$0 \leq a \leq 4$; $0 \leq b \leq 4$; $0 \leq c \leq 4$; $0 \leq d \leq 4$; $0 \leq e \leq 4$;
$a+b+c+d+e=4$; and
$2a+3b+4c+d+5e=10-y-n+z$.

6. The lighting device according to claim 1, wherein the first luminescent material is selected from the group consisting of $(Y,Gd,Lu)_3(Al,Ga)_5O_{12}:Ce^{3+}$, $CaSc_2O_4:Ce^{3+}$, $CaS:Ce^{3+}$ and $La_3Si_6N_{11}:Ce^{3+}$, and wherein the second luminescent material (220) is selected from the group of $(Sr,Ba,Ca)(Se,S):Eu$, $SrLiAl_3N_4:Eu$, $CaBe_3SiN_4:Eu$, $SrAl_2Mg_2N_4:Eu$, and $K_2SiF_6:Mn$.

7. The lighting device according to claim 1, wherein the wavelength converter element is configured at a non-zero distance from the first solid state light source and the second solid state light source.

8. The lighting device according to claim 1, wherein the wavelength converter element is configured as window of a mixing chamber, wherein the first solid state light source and the second solid state light source are configured to provide their solid state light source light in the mixing chamber, and wherein the solid state light sources and the wavelength converter element are configured to provide lighting device light downstream from the wavelength converter element, wherein lighting device light comprises white light or wherein the lighting device is controllable to provide lighting device light being white light.

9. The lighting device according to claim 1, wherein the first luminescent material and the second luminescent material are embedded in the wavelength converter element.

10. The lighting device according to claim 1, wherein the wavelength converter element comprises a support comprising one or more coatings, wherein one or more of the coatings comprise one or more of the first luminescent material and the second luminescent material.

11. The lighting device according to claim 1, wherein the lighting device does not comprise a diffuser element arranged downstream from the wavelength converter element.

12. The lighting device according to claim 1, wherein a power of the second solid state light source is equal to or larger than 80% of a total power of the first solid state light source and second solid state light source.

13. The lighting device according to claim 1, wherein an absorption ratio $ABS_{460}/ABS_{410}$ (where $ABS_{460}$=absorption for 460 nm and $ABS_{410}$=absorption for 410 nm) is at least 1.5 for the first luminescent material and wherein the absorption ratio $ABS_{460}/ABS_{410}$ is at least 1.1 for the second luminescent material.

* * * * *